United States Patent
Hosono (10) Patent No.: US 7,405,975 B2
(45) Date of Patent: Jul. 29, 2008

(54) THRESHOLD VALUE READ METHOD OF NONVOLATILE SEMICONDUCTOR MEMORY DEVICE AND NONVOLATILE SEMICONDUCTOR MEMORY DEVICE

(75) Inventor: Koji Hosono, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 41 days.

(21) Appl. No.: 11/485,483

(22) Filed: Jul. 13, 2006

(65) Prior Publication Data

US 2007/0133287 A1    Jun. 14, 2007

(30) Foreign Application Priority Data

Dec. 13, 2005    (JP) ............................... 2005-359337

(51) Int. Cl.
*G11C 16/04*    (2006.01)
(52) U.S. Cl. .............................. 365/185.17; 365/185.22
(58) Field of Classification Search ............ 365/185.17, 365/185.22, 185.03
See application file for complete search history.

(56) References Cited

U.S. PATENT DOCUMENTS

| 6,850,435 | B2  | 2/2005  | Tanaka |
| 6,975,537 | B2* | 12/2005 | Lutze et al. ............ 365/185.18 |
| 7,009,889 | B2* | 3/2006  | Tran et al. ............. 365/185.29 |

FOREIGN PATENT DOCUMENTS

| KR | 10 1991-0017443 | 11/1991 |
| KR | 1997-0051349 | 7/1997 |

* cited by examiner

*Primary Examiner*—Vu A Le
(74) *Attorney, Agent, or Firm*—Oblon, Spivak, McClelland, Maier & Neustadt, P.C.

(57) ABSTRACT

A threshold voltage read method of a nonvolatile semiconductor memory device is disclosed. The threshold voltage read method applies a first threshold voltage measuring read voltage to the word line with a selection gate kept in a non-conductive state and then makes the selection gate conductive to read out a threshold voltage of the first data at the time of reading out the threshold voltage of the first data. Then, it applies a second threshold voltage measuring read voltage to the word line with the selection gate kept in the conductive state to read out a threshold voltage of the second data at the time of reading out the threshold voltage of the second data.

17 Claims, 10 Drawing Sheets

THRESHOLD VALUE READ METHOD OF NONVOLATILE SEMICONDUCTOR MEMORY DEVICE AND NONVOLATILE SEMICONDUCTOR MEMORY DEVICE

CROSS-REFERENCE TO RELATED APPLICATIONS

This application is based upon and claims the benefit of priority from prior Japanese Patent Application No. 2005-359337, filed Dec. 13, 2005, the entire contents of which are incorporated herein by reference.

BACKGROUND OF THE INVENTION

1. Field of the Invention

This invention relates to a nonvolatile semiconductor memory device and more particularly to a threshold voltage read method which reads out a threshold voltage of a rewritable nonvolatile semiconductor memory device and a nonvolatile semiconductor memory device used to perform the read method.

2. Description of the Related Art

Recently, the memory capacity of a rewritable nonvolatile semiconductor memory device, for example, the memory capacity of a NAND flash memory has been stably increased. As the technique for increasing the memory capacity, the technique for miniaturizing memory cells and forming memory data into a multi-level form is provided. The distribution of threshold voltages of memory cells of a multi-level flash memory is narrower than that of a binary memory and the control operation for the threshold voltages is strict than that in the binary memory. Further, since a plurality of read voltages applied to word lines are required, it is necessary to precisely perform the strict threshold voltage control operation.

In order to precisely perform the threshold voltage control operation, for example, it is necessary to make a highly precise circuit design of a data write circuit such as a page buffer. In order to make the highly precise circuit design, it is preferable to acquire actual information from the device itself and feed back the actual information to the circuit design.

As one example of the operation of acquiring actual information, an item of "measurement of distribution of threshold voltages of memory cells" is provided. The item is to actually read out and check the form of the threshold voltage distribution from the device itself after data is actually written into a memory cell. The information acquired at this time is utilized for determining various control parameters for controlling the threshold voltages, such as timing setting values used for write verify operations or read operations, and voltages applied to word and bit lines.

However, when the accuracy of the read threshold voltage is not so high, or when there is no excellent function of estimating the threshold voltage distribution, it adversely affects the optimization of the flash memory that stores multi-level data.

BRIEF SUMMARY OF THE INVENTION

A threshold voltage read method of a nonvolatile semiconductor memory device according to a first aspect of the present invention which includes a memory cell unit having a selection gate and memory cells each storing three or more data items according to threshold voltages, applies first verify read voltage to a word line with the selection gate kept in a nonconductive state, then makes the selection gate conductive to verify first data among the three or more data items, and changes the first verify read voltage to second verify voltage with the selection gate kept in the conductive state to verify second data among the three or more data items after the first data, comprises applying first threshold voltage measuring read voltage to the word line with the selection gate kept in the nonconductive state and then making the selection gate conductive to read out a threshold voltage of the first data at the time of reading out the threshold voltage of the first data, and applying second threshold voltage measuring read voltage to the word line with the selection gate kept in the conductive state to read out a threshold voltage of the second data at the time of reading out the threshold voltage of the second data.

A nonvolatile semiconductor memory device according to a second aspect of the present invention comprises a memory cell unit having a selection gate and memory cells each storing three or more data items according to levels of threshold voltages, and a write control circuit which controls a write operation of writing data into the memory cell, wherein the write control circuit applies first verify read voltage to a word line with the selection gate kept in a nonconductive state, then makes the selection gate conductive and changes the first verify read voltage to second verify voltage with the selection gate kept in the conductive state at the verify read operation time, applies first threshold voltage measuring read voltage to the word line with the selection gate kept in the nonconductive state and then making the selection gate conductive at the time of reading out the threshold voltage of first data, and applies second threshold voltage measuring read voltage to the word line with the selection gate kept in the conductive state at the time of reading out the threshold voltage of second data.

DETAILED DESCRIPTION OF THE INVENTION

The threshold voltage read operation of a semiconductor integrated circuit device according to a reference example of the present embodiment of this invention is explained before explaining the present embodiment.

Reference Example

Figure 5:
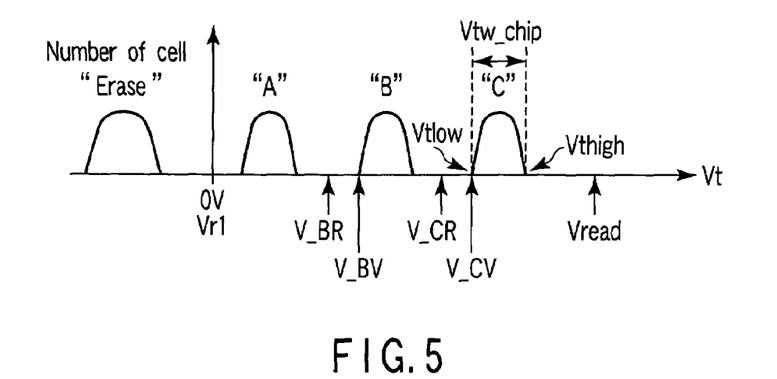
FIG. 5 is a diagram showing the distribution of threshold voltages of memory cells.

The semiconductor integrated circuit device according to the reference example is a multi-level memory. The distribution of threshold voltages of the memory cells is shown in FIG. 5. In this example, the threshold voltage in the erase state is negative voltage and the threshold voltage in the write state has three levels; "A", "B" and "C".

(Verify Read Operation)

Figure 7:
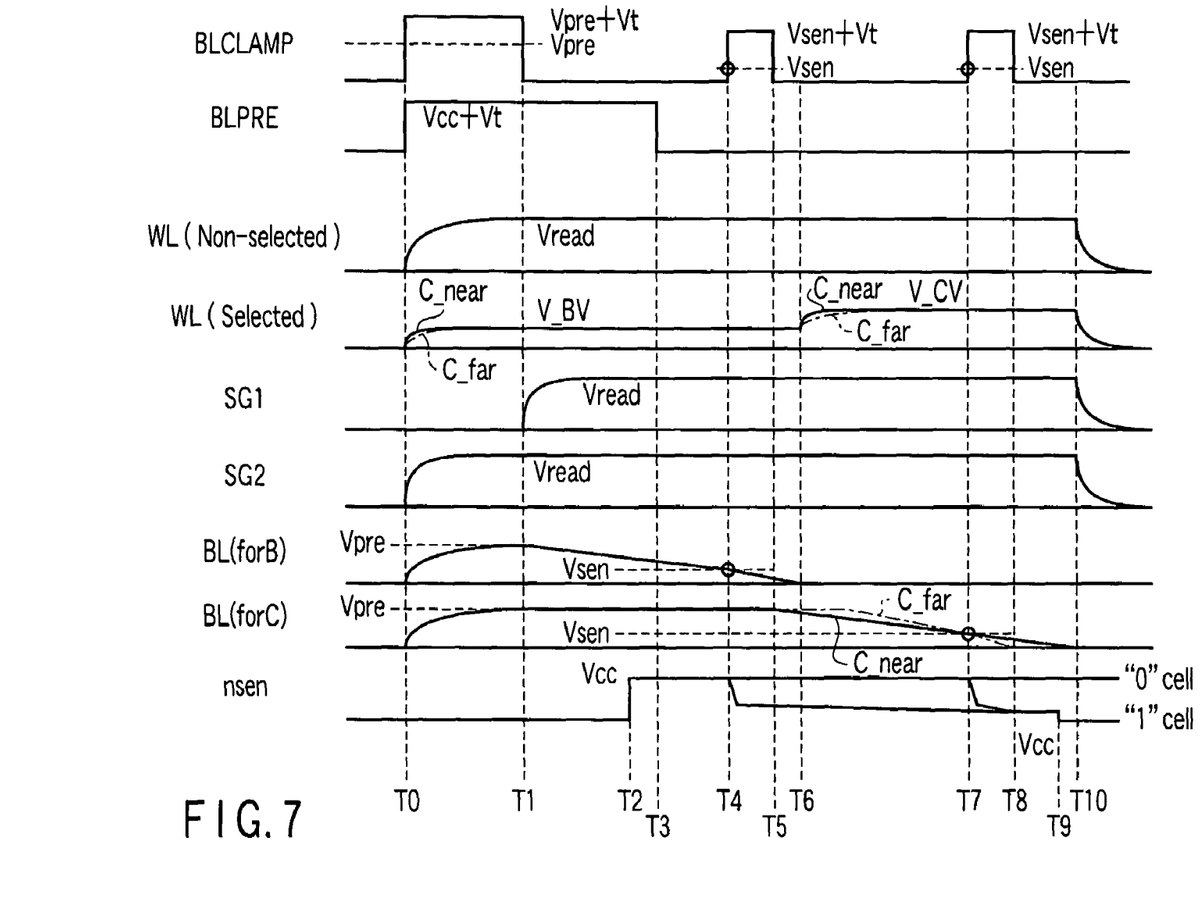
FIG. 7 is an operation waveform diagram showing the verify read operation of the semiconductor integrated circuit device according to the reference example.

FIG. 7 is an operation waveform diagram showing the verify read operation of the semiconductor integrated circuit device according to the reference example.

In this case, it is assumed that the verify read operation shown in FIG. 7 is performed when the "B" level and "C" level are written.

A bit to be written to the "B" level is checked in a period of time in which the voltage of the selected word line is set at V_BV and a bit to be written to the "C" level is checked in a period of time in which the voltage of the selected word line is set at V_CV. More specifically, completion of the write operation for a bit to be written to the "B" level is judged according to whether the bit line potential is lowered from Vpre to Vsen in a period from time T1 to time T4. When the bit line potential is less than Vsen at time T4, this means that a cell current greater than a preset cell current defining the threshold voltage flows. Accordingly, the corresponding bits are judged to be insufficient for writing, and write control is performed at time T4 to cause a bit line potential higher than Vsen to be left. Likewise, completion of the write operation for a bit to be written to the "C" level is judged according to whether the bit line potential is lowered from Vpre to Vsen in a period from time T6 to time T7. Also concerning the "C" level, write control is performed at time T7 to cause the bit line voltage to become higher than Vsen.

Figure 6:
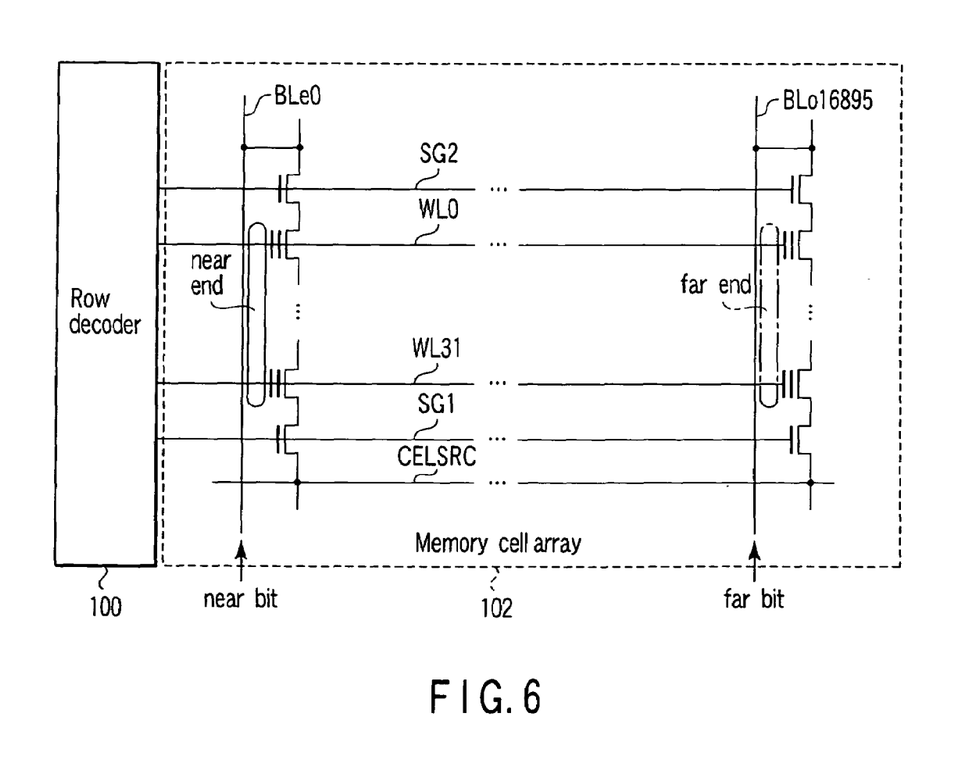
FIG. 6 is a diagram showing a memory cell array of a semiconductor integrated circuit device according to a reference example.

FIG. 6 is a diagram showing a memory cell array of the semiconductor integrated circuit device according to the reference example. This figure shows the connection relationship between the memory cells and row decoder of the NAND flash memory.

As shown in FIG. 6, the word lines WL are driven by a row decoder 100. The row decoder 100 is arranged on one side of a memory cell array 102 and one-side ends of the word lines WL are connected to the row decoder. The NAND flash memory realizes a memory structure and operation specialized for high-density and large-capacity. Therefore, it has very long word lines WL, compared to other semiconductor memories of, for example, 2 kBytes or 4 kBytes. That is, the word lines WL have a very large CR time constant. Since the word lines WL have the very large CR time constant, a large time difference of several µs occurs between the speed of voltage rising at the end of each word line WL near the row decoder 100, and that of voltage rising at the end far from the row decoder 100. In FIG. 7, the waveform at the near end is indicated by a reference symbol "C_near" and waveform at the far end is indicated by a reference symbol "C_far".

The verify read operation of the "B" level is performed after time T1 at which the selection gate SG1 is made conductive. Time T1 comes after time T0 at which the "B" level verify read voltage V_BV is applied to the word line WL. At time T1, both of the voltages of the word line WL at the near end and far end reach the verify read voltage V_BV.

Figure 9:
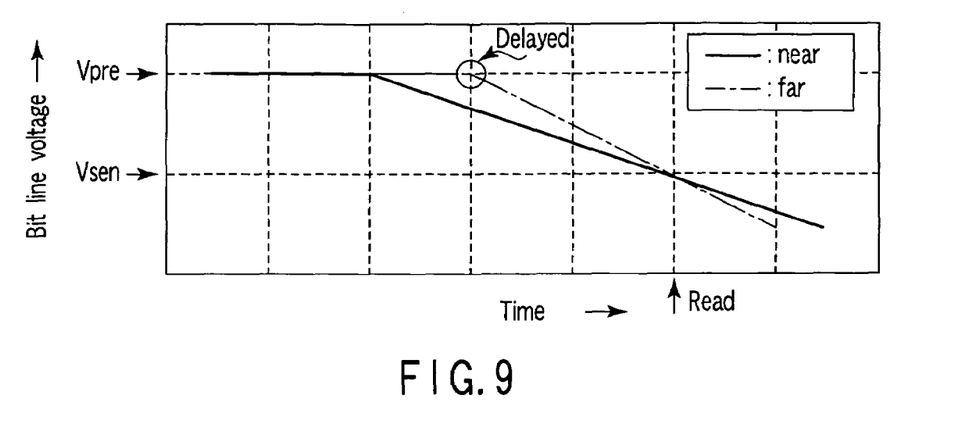
FIG. 9 is a diagram showing the relation between bit line voltage and time.

On the other hand, the "C" level verify read operation is performed by raising the voltage of the word line WL from the "B" level verify read voltage V_BV to the "C" level verify read voltage V_CV while the selection gate SG1 is kept conductive. The voltage of the word line WL is raised to the voltage V_CV at time T6. At time T6, the voltage of the word line WL at the near end reaches the voltage V_CV in a short period of time and it takes a bit longer for the voltage of the word line WL at the far end to reach the voltage V_CV. Therefore, the time at which the voltage of the bit line BL of a bit near the far end (which is hereinafter referred to as a far bit) starts to be lowered lags the time at which the voltage of the bit line BL of a bit near the near end (which is hereinafter referred to as a near bit) starts to be lowered. This phenomenon is shown in FIG. 9 in an enlarged form.

As a result of a delay in the discharge time of the bit line BL of the far bit, the actual bit line discharge period of time up to read time T7 is shortened to a certain degree. The bit line discharge state, in which the voltage at the bit line BL is reduced from Vpre to Vsen, is the write verify determination state.

When the threshold voltage is written into each memory cell by such a verify read operation, a read operation is also performed using a similar operation waveform. Namely, a relative margin for data reading as shown in FIG. 5 can be secured by changing the voltages at the selected word line WL from V_BV to V_BR and from V_CV to V_CR, using the timing shown in FIG. 7.

Accordingly, in the read operation in which voltage V_CV is applied at the word line WL, unless the threshold voltage controlled by the verify operation is very close to the threshold level of "B", the relative read margin can be secured, although the near and far bits differ in the actual bit line discharge time.

(Threshold Value Readout Operation)

Figure 8:
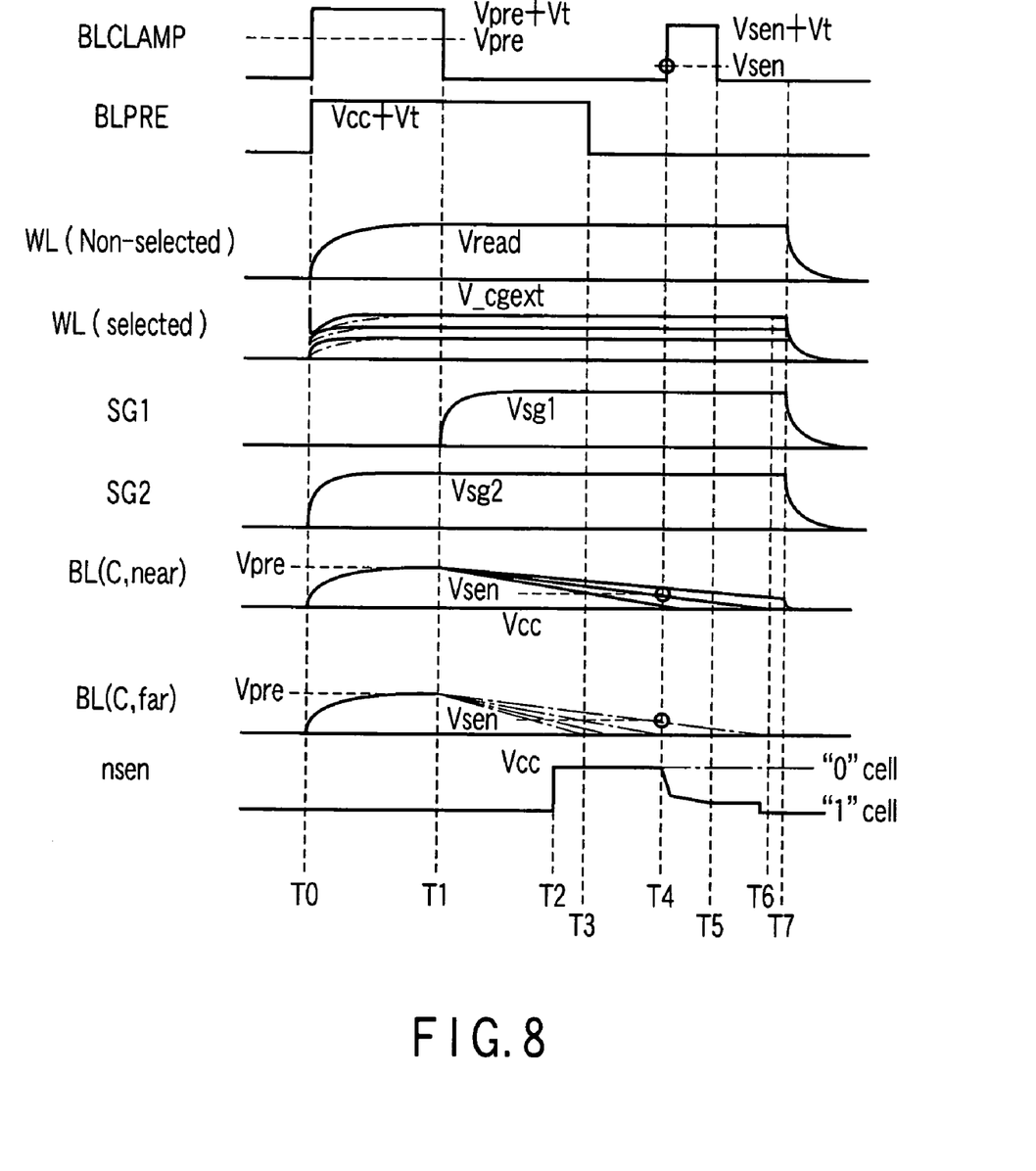
FIG. 8 is an operation waveform diagram showing the threshold voltage read operation of the semiconductor integrated circuit device according to the reference example.

FIG. 8 is an operation waveform diagram showing the threshold voltage read operation of the semiconductor integrated circuit device according to the reference example.

The threshold voltage read operation is performed by applying threshold voltage measuring read voltage V_cgext to the word line WL from the outside of the semiconductor integrated circuit device.

The read operation is iterated while changing the voltage V_cgext in units of preset voltages. During this process, it is judged at which value of the voltage V_cgext, the voltage at the bit line BL is not more than or less than the sense voltage Vsen, thereby acquiring the threshold value distribution of the memory cell.

In FIG. 8, the threshold voltage read operation performed when the distribution of the "C" level threshold voltages is checked is shown.

Figure 10:
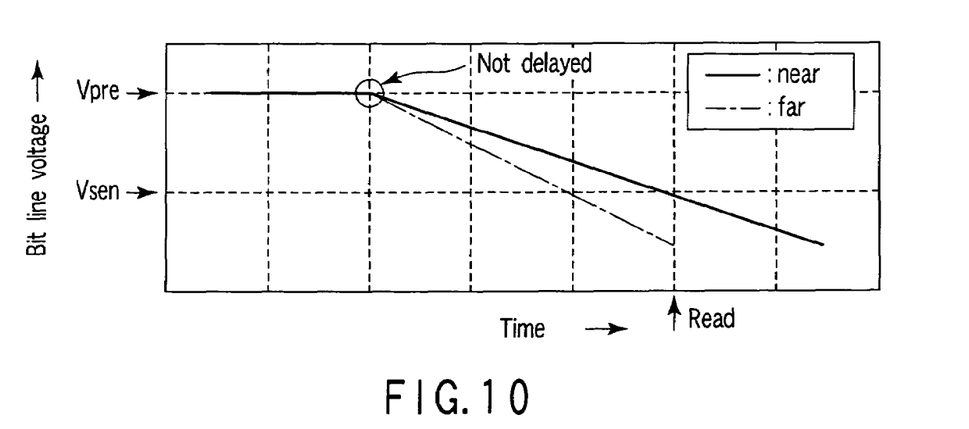
FIG. 10 is a diagram showing the relation between bit line voltage and time.

As shown in FIG. 8, the "C" level threshold voltage read operation of this example is performed after time T1 at which the selection gate SG1 is made conductive. Time T1 comes after time T0 at which the voltage V_cgext is applied to the word line WL. At time T1, both of the voltages of the word line WL at the near end and far end reach the voltage V_cgext. That is, the time at which the voltage of the bit line BL of the far bit starts to be lowered will not lag the time at which the voltage of the bit line BL of the near bit starts to be lowered although the "C" level threshold voltage read operation is performed. This phenomenon is shown in FIG. 10 in an enlarged form.

"The time at which the voltage starts to be lowered is not delayed" means that data is read out in a condition different from that of the verify read operation.

This causes the situation that the actually detected threshold voltage distribution will differ from the threshold voltage distribution acquired by the determination of the sense amplifier during a normal read operation or verify read operation, as now will be described.

Figure 11:
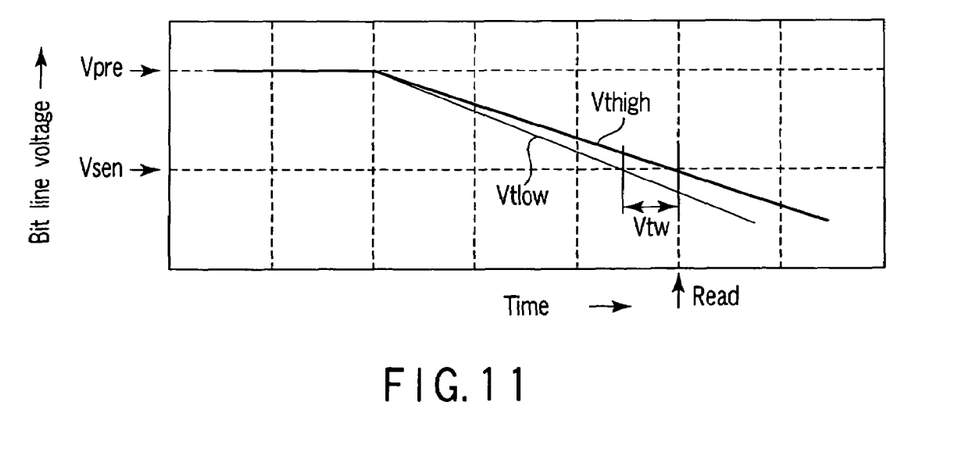
FIG. 11 is a diagram showing the relation between bit line voltage and time.
Figure 12:
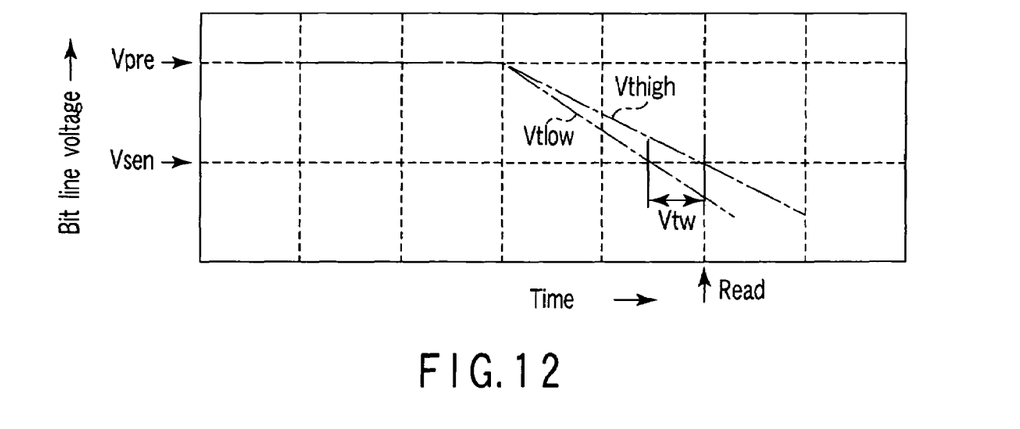
FIG. 12 is a diagram showing the relation between bit line voltage and time.
Figure 13:
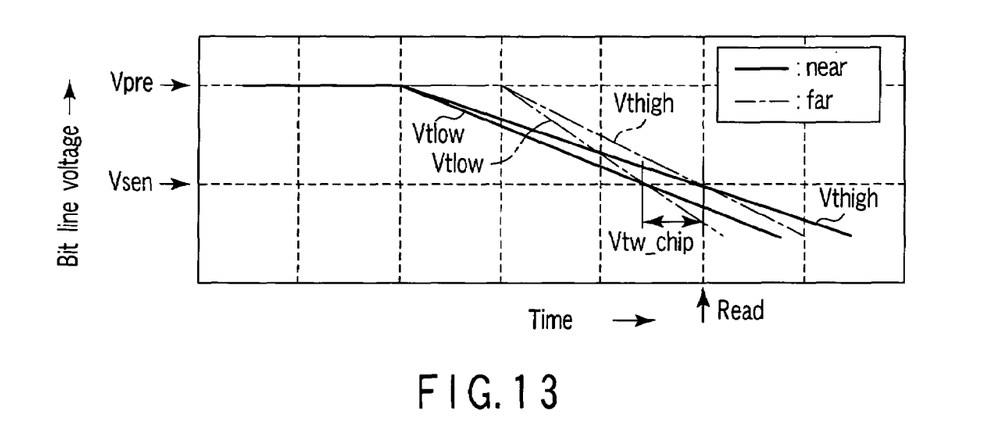
FIG. 13 is a diagram showing the relation between bit line voltage and time.

FIGS. 11 to 13 are diagrams each showing the relation between bit line voltage and time.

FIGS. 11 to 13 visualize the threshold voltage distribution acquired by the sense amplifier during the normal read or verify operation in the chip. FIG. 11 shows a case of the near bit, FIG. 12 shows a case of the far bit and FIG. 13 shows a case of both of the near bit and far bit.

In practice, the threshold voltages of the memory cell are not distributed at one voltage point and distributed in a certain range of voltages.

Vtw shown in FIGS. 11 and 12 indicates a difference in the bit line discharge waveform corresponding to the threshold voltage distribution.

The lower limit of the threshold voltage distribution Vtw is Vtlow and the upper limit thereof is Vthigh. As shown in FIGS. 11 to 13, the bit line voltage is rapidly lowered in the case of Vtlow and the bit line voltage is slowly lowered in the case of Vthigh. In the threshold voltage read operation, for example, Vtlow is observed when the voltage of the bit line BL reaches the sense voltage Vsen while the voltage V_cgext of the word line WL is kept low. Further, Vthigh is observed when the voltage of the bit line BL reaches the sense voltage Vsen while the voltage V_cgext of the word line WL is kept high.

Namely, in the normal verify read operation in the chip described referring to FIG. 7, the sense amplifiers senses, as the threshold voltage distribution Vtw_chip of the memory cell, the range of reduction (from Vtlow to Vthigh) in the voltage at the bit line BL. Actually, Vtw_chip in FIG. 13 indicates a difference in the bit line discharge waveform corresponding to the threshold voltage distribution Vtw_chip in FIG. 5. The important thing is that the degree of overlap between the bit line discharge waveforms of the near and far bits is high near the time at which the bit line voltage is sensed.

Figure 14:
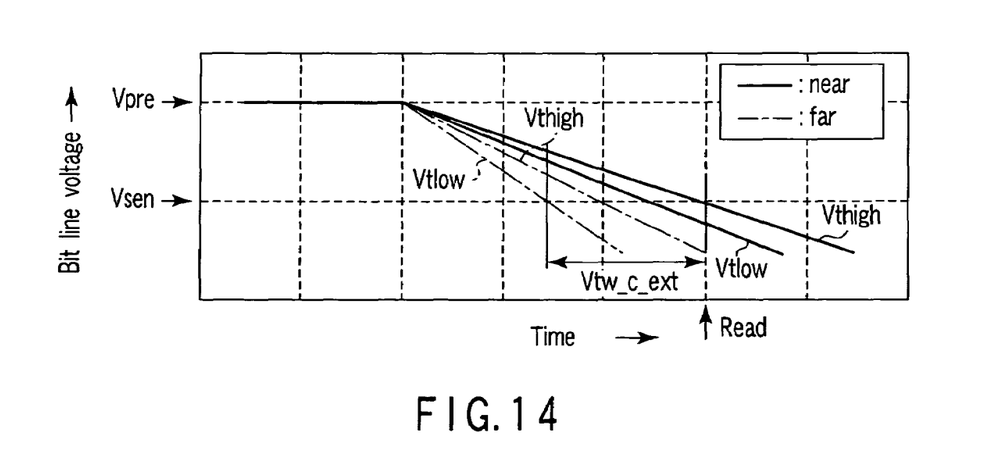
FIG. 14 is a diagram showing the relation between bit line voltage and time.

A case wherein the time at which the voltage of the bit line BL of the far bit starts to be lowered will not lag the time at which the voltage of the bit line BL of the near bit starts to be lowered is shown in FIG. 14.

In the case of "the time at which the voltage starts to be lowered is not delayed", as shown in FIG. 14, the range in which the voltage of the bit line BL is lowered is enlarged.

Assume here that the bit line discharge time set between T6 and T7 is substantially equal to that set between T1 to T4 during threshold voltage reading. If this is shown in a general threshold voltage distribution, the lower limit Vtlow of the threshold voltage distribution is less than the "C" level verify read voltage V_CV. This is shown in FIG. 15.

Figure 15:
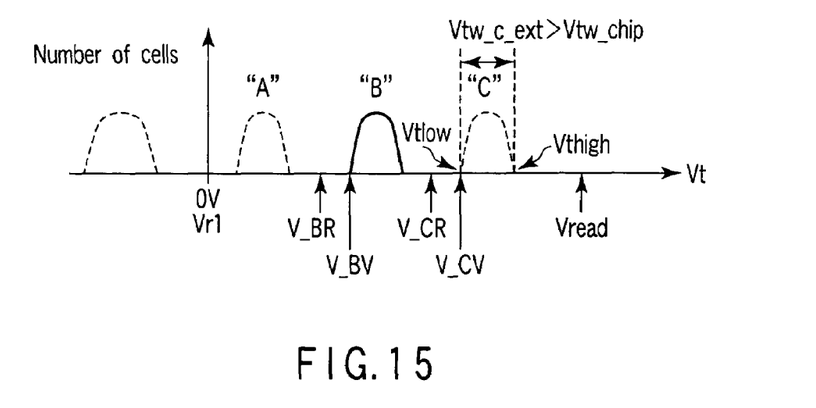
FIG. 15 is a diagram showing the threshold voltage distribution of memory cells.

That is, in this case, since the bit line discharge time of the near bit is substantially equal to that for threshold voltage reading, it is judged that the threshold voltage at the near bit is equal to or higher than the verify read voltage V_CV shown in FIG. 15. In contrast, since the actual bit line discharge time is shorter than the bit line discharge time during the threshold voltage read operation, it is judged that the threshold voltage at the memory cell connected to the far bit is lower than the verify read voltage V_CV.

Figure 16:
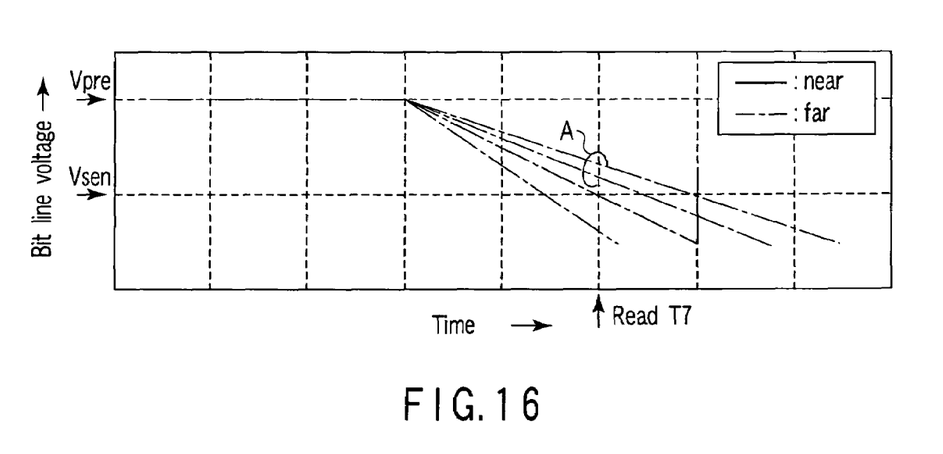
FIG. 16 is a diagram showing the relation between bit line voltage and time.
Figure 17:
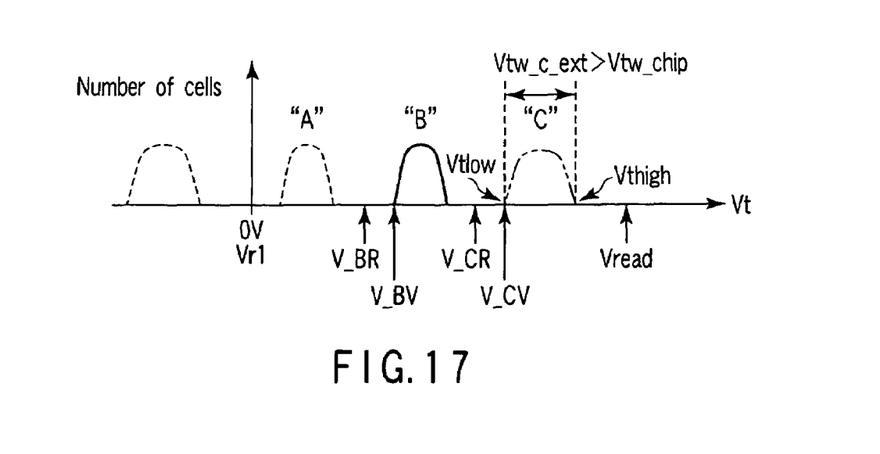
FIG. 17 is a diagram showing the threshold voltage distribution of memory cells.

On the other hand, if the bit line discharge time between T6 to T7 is set longer, i.e., if the actual bit line discharge time of the far bit is set substantially equal to that during threshold voltage reading, the threshold voltage of the near bit appears high as shown in FIG. 16. In this case, the results of "C" level threshold voltage reading appears as a threshold voltage distribution widening at high level, as shown in FIG. 17.

Even in this state, the threshold voltage read operation is needed. This is because the state during reading differs between "B" level verification and "C" level verification, and hence it is necessary to confirm whether the distance between two distributions is sufficient, and whether a sufficient margin exists between the distributions, when comparison is performed using a read method of the same condition. However, since the state during threshold voltage reading differs as mentioned above, the distribution may appear to widen at low level or at high level as shown in FIG. 15 or 17. In other words, it is difficult to judge the positional relationship between the verify voltage V_CV and the threshold voltage distribution, which makes it impossible to accurately estimate the distribution.

There will now be described one embodiment of this invention with reference to the accompanying drawings. In this explanation, common reference symbols are attached to like portions throughout the drawings.

Figure 1:
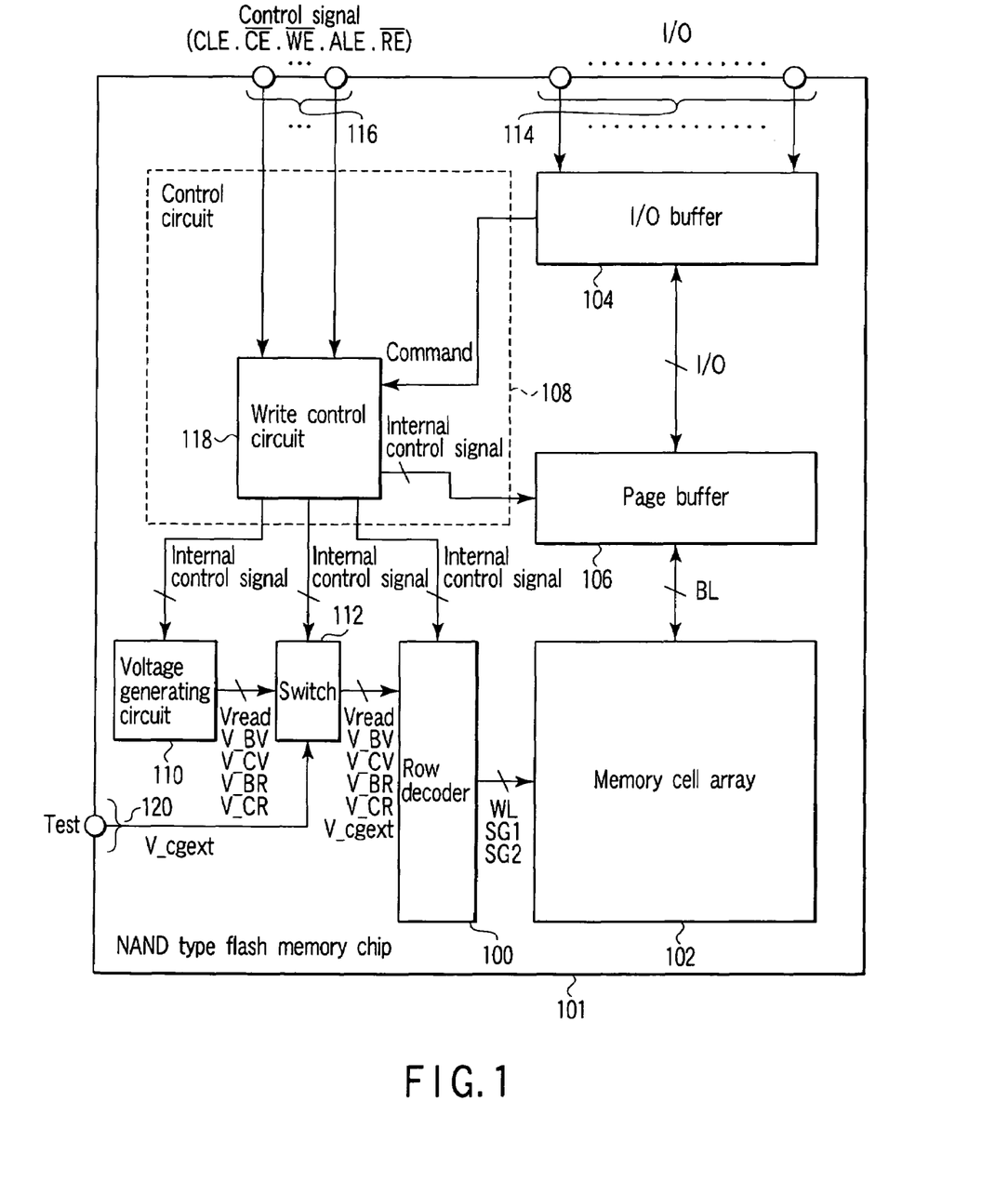
FIG. 1 is a block diagram showing one example of a semiconductor integrated circuit device according to one embodiment of this invention.

FIG. 1 is a block diagram showing one example of a semiconductor integrated circuit device according to one embodiment of this invention. In this example, a NAND flash memory is shown as one example of the semiconductor integrated circuit device, but this invention can be applied to a memory other than the NAND flash memory.

As shown in FIG. 1, in a NAND flash memory chip 101, an I/O buffer 104, page buffer 106, control circuit 108, voltage generating circuit 110 and switch 112 are arranged in addition to the row decoder 100 and memory cell 102 shown in the reference example.

The I/O buffer 104 is connected to an I/O pad 114 to output readout data and input write data and command data.

The page buffer 106 is connected to the I/O buffer via an IO line to temporarily hold readout data of one page and write data of one page.

Since FIG. 1 is a very simplified view, it appears from FIG. 1 that the page buffer is directly connected to the I/O buffer. Actually, however, a column decoder, data output circuit and data input buffer circuit, etc. are interposed therebetween.

Further, a data latch (sense amplifier) circuit is provided in the page buffer 106. The data latch circuit temporarily holds readout data and judges the readout data at the data read time. Further, the data latch circuit temporarily holds write data and judges whether or not the write data is correctly written at the data write time (verify).

The control circuit 108 is connected to a control signal pad 116 and I/O buffer and manages the whole portion of the chip 101. For example, the control circuit 108 receives control signals (CLE, /CE, /WE, ALE, /RE) and command data via the I/O buffer 104 and manages the read, write, erase and data input/output operations. In FIG. 1, a write control circuit 118 of the control circuit 108 is shown.

The voltage generating circuit 110 generates voltages used in the chip 101. In this example, voltages (V_read, V_BV, V_CV, V_BR, V_CR) applied to the row selection lines (word line and selection gate line) at the read or write time are shown as one example of the voltages.

The switch 112 is provided between the voltage generating circuit 110 and the row decoder 100. The switch 112 permits threshold voltage measuring voltage V_cgext to be applied to the selected word line at the threshold voltage read time instead of the voltages V_BV, V_CV, V_BR, V_CR, for example. The threshold voltage measuring voltage V_cgext is applied to the switch 112 from the outside of the chip 101, for example. In this example, the threshold voltage measuring voltage V_cgext is applied to the switch 112 via a test pad 120.

Figure 2:
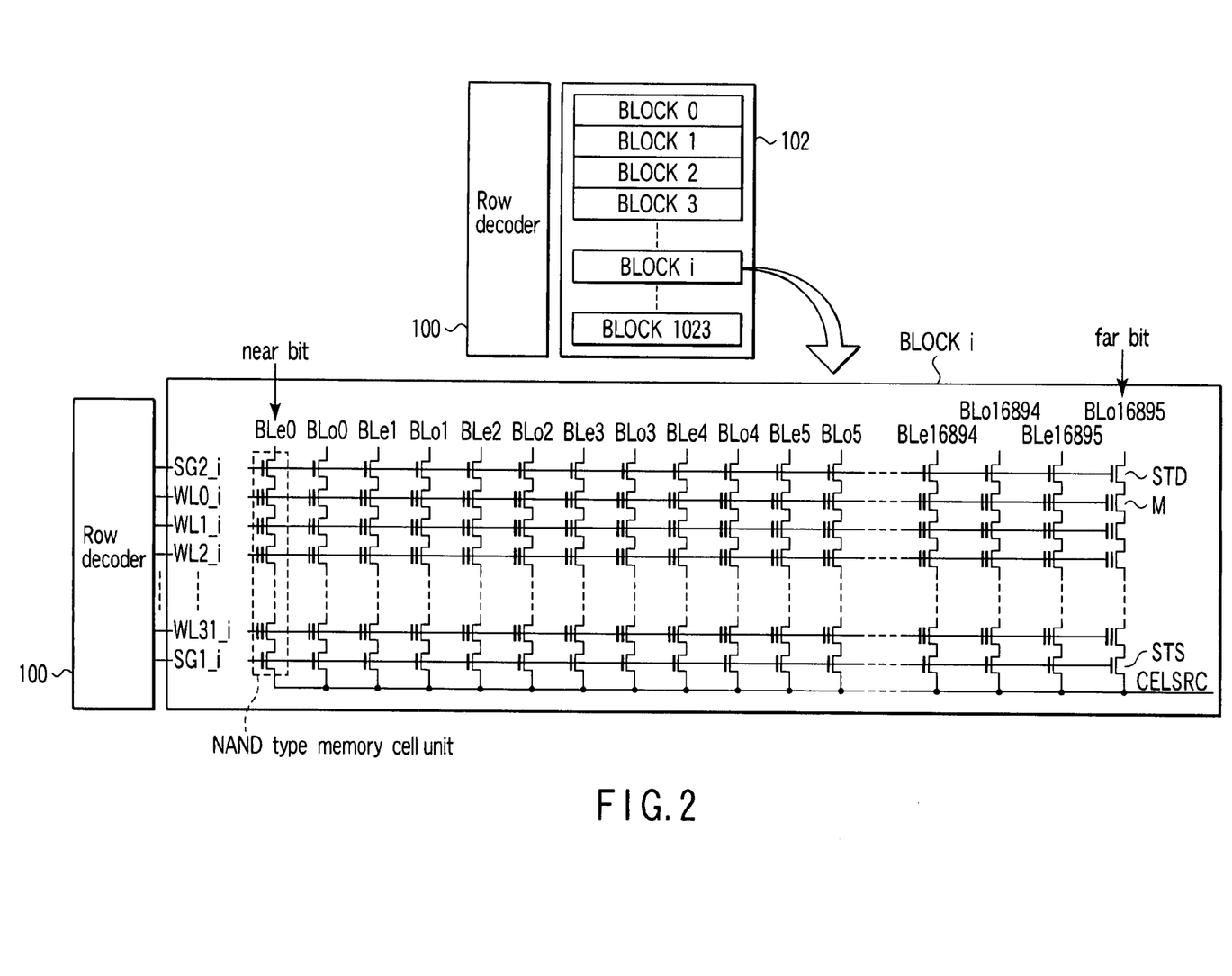
FIG. 2 is a diagram showing one example of a memory cell array shown in FIG. 1.

FIG. 2 is a diagram showing one example of the memory cell array 102 shown in FIG. 1.

As shown in FIG. 2, the memory cell array 102 is divided into a plurality of blocks, for example, 1024 blocks BLOCK0 to BLOCK1023. The block is a minimum unit for erasing. Each block BLOCKi includes a plurality of NAND memory units, for example, 33792 NAND memory units. In this example, each NAND memory unit includes two selection transistors STD, STS and a plurality of memory cells M (in this example, 32 memory cells) serially connected between the two selection transistors. The memory cell M is a memory cell which can store two or more data items according to the levels of threshold voltages.

One end of the NAND memory unit is connected to a bit line BL via the selection transistor STD whose gate is connected to a selection gate line SG2 and the other end thereof is connected to a common source line CELSRC via the selection transistor STS whose gate is connected to a selection gate line SG1. The gate of each memory cell M is connected to a corresponding one of word lines WL. Even-numbered bit lines BLe and odd-numbered bit lines BLo counted from "0" are independently subjected to the data write and read operations. The data write and read operations are simultaneously performed for the 16896 memory cells connected to the bit lines BLe, for example, among the 33792 memory cells connected to one word line WL. One-bit data is stored in each memory cell M and one-bit data items of the 16896 memory cells are collected to configure one page unit.

Each page is a minimum unit for reading or writing, and when the number of I/O pins is 8, the page length is expressed by 2112 Bytes. When each memory cell M stores 2-bit data, the 16896 memory cells store data of two pages. Likewise, the 16896 memory cells connected to the bit lines BLo configure a different two pages and the data write and read operations are simultaneously performed for the memory cells in the page.

Next, the operation of the semiconductor integrated circuit device according to the present embodiment is explained.

The read and erase operations of the semiconductor integrated circuit device according to the present embodiment are the same as those of a general NAND flash memory, and therefore, explanation thereof is omitted in this specification.

Further, the write operation may also be the same as that of the general NAND flash memory. However, concerning the verify read operation, assume that the same operation as explained in the reference example is performed. Explanation is made with reference to the reference example and omitted here.

(Threshold Value Readout Operation)

Figure 3:
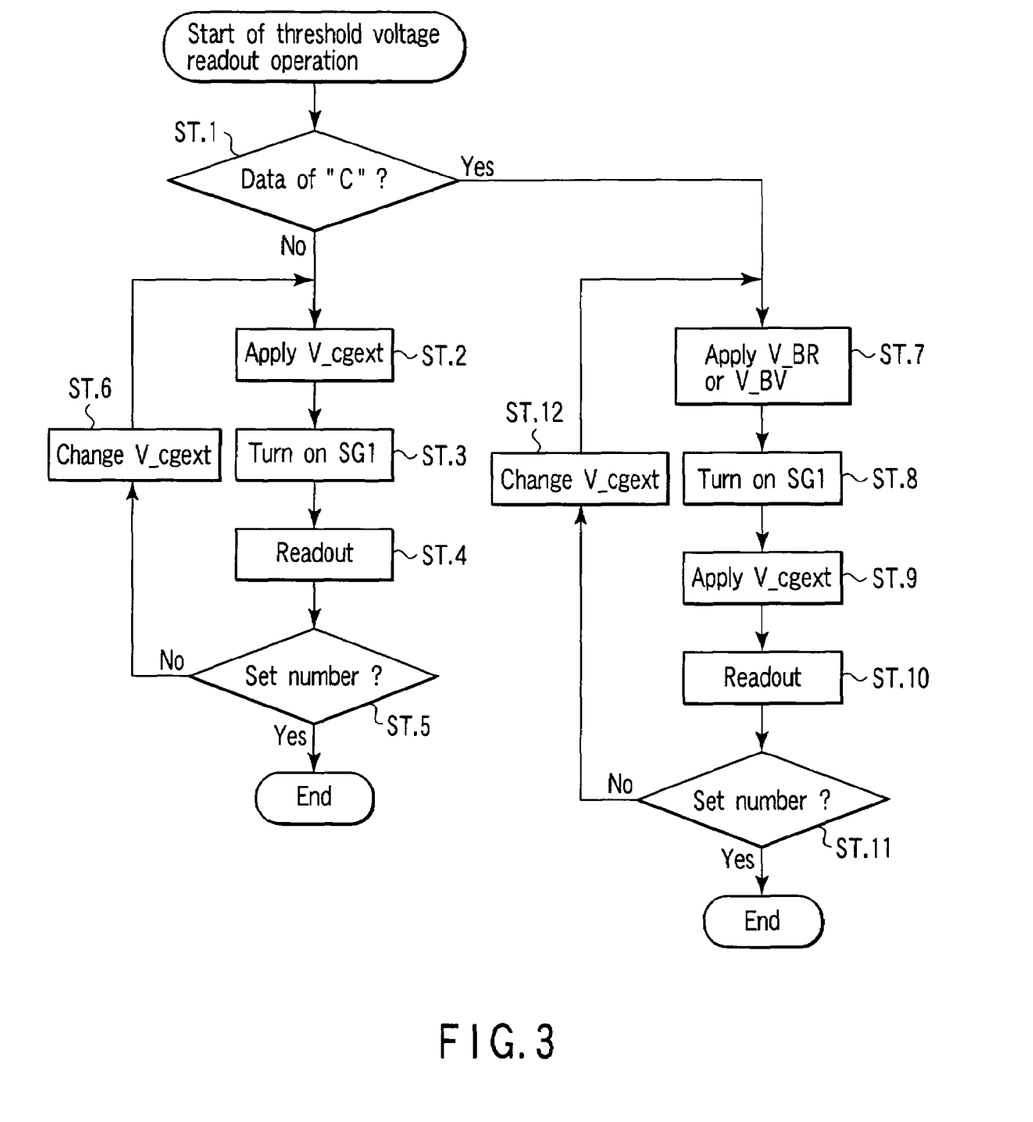
FIG. 3 is a flow chart showing one example of the flow of the threshold voltage read operation of the semiconductor integrated circuit device according to one embodiment of this invention.

FIG. 3 is a flow chart showing one example of the flow of the threshold voltage read operation of the semiconductor integrated circuit device according to one embodiment of this invention.

First, as shown in FIG. 3, whether or not the operation is the read operation for a threshold voltage of data of the "C" level (refer to FIG. 5) is judged (ST. 1).

When it is judged that the operation is not the read operation for a threshold voltage of data of the "C" level ("NO"), the threshold voltage measuring voltage V_cgext is applied to the selected word line WL (ST. 2). Subsequently, the selection gate SG1 is turned on (ST. 3) to start bit line discharge. For simplicity, FIG. 3 does not show the selection gate SG2. However, assume that the selection gate SG2 is turned on before the selection gate SG1 is turned on. Since the state that enables bit line discharge is set at the same time as the turn-on of SG1, the "turn-on of SG1" is important. Subsequently, the bit line potential is sensed to thereby latch data, and then one-page data is read from the page buffer to the outside of the chip (ST. 4). This operation is repeated a preset number of times while changing the voltage V_cgext (ST. 5, ST. 6). For example, when reading the threshold voltage while changing V_cgext in units of 10 mV within the range of 3V, the above operation is iterated 300 times. If variations in the number of "0" data items read from the page buffer before and after V_cgext changes are arranged along the Y axis, and the changed levels of V_cgext are arranged along the X axis, the threshold voltage distributions as shown in FIG. 5 are acquired. When the number of read operations reaches a preset value (Yes at step ST. 5), the operation of reading the threshold voltage is finished.

Figure 4:
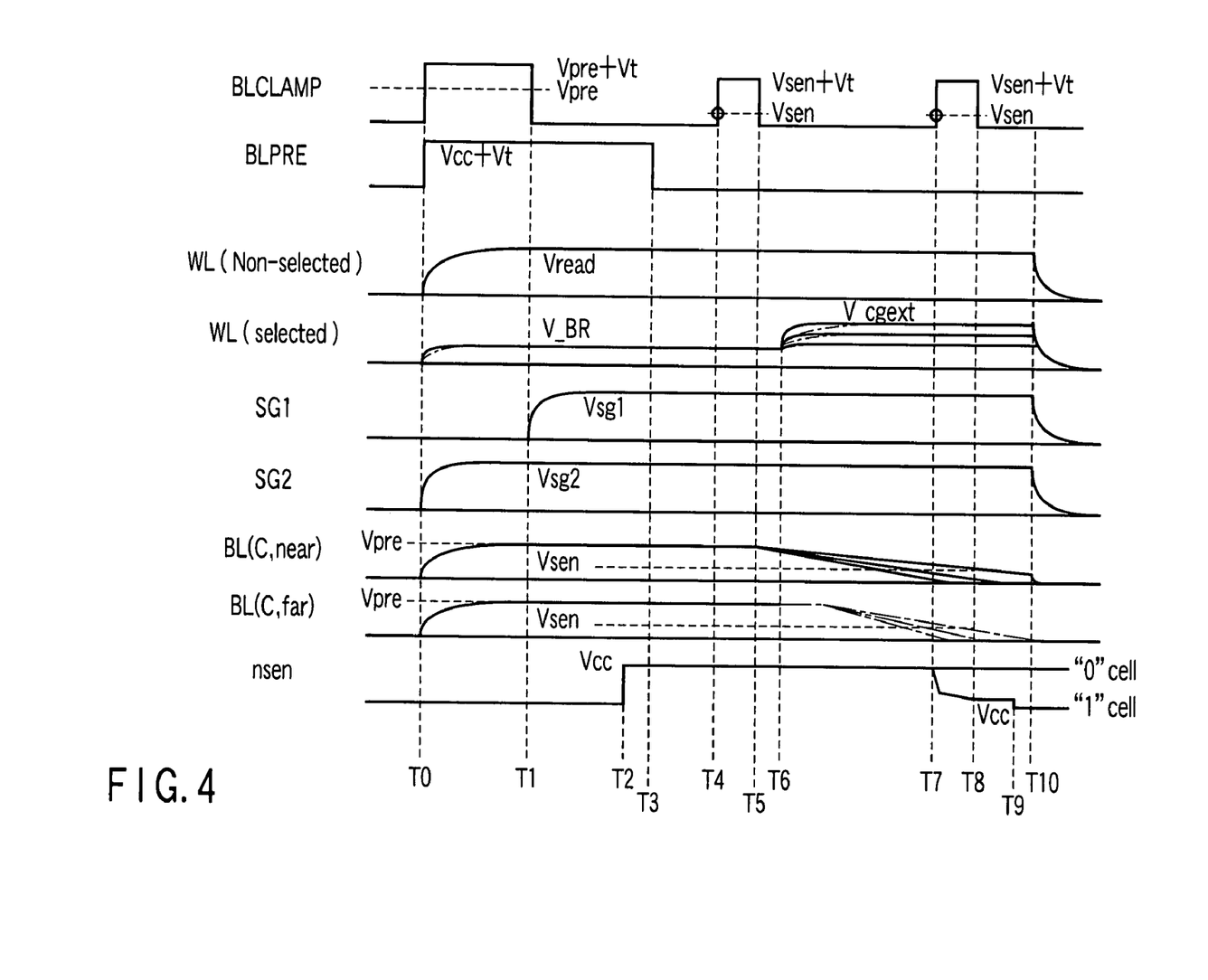
FIG. 4 is an operation waveform diagram showing the threshold voltage read operation of the semiconductor integrated circuit device according to one embodiment of this invention.

When it is judged that the operation is the read operation for the threshold voltage of data of the "C" level ("YES"), the voltage V_BR or V_BV is applied to the selected word line WL (ST. 7). Then, the selection gate SG1 is turned ON (ST. 8). Subsequently, the threshold-voltage-measuring voltage V_cgext is applied to the selected word line WL (ST. 9). It is desirable to make the application time of V_cgext identical to that in the case of FIG. 7. Further, it is important to change the voltage at the selected word line WL to V_cgext after SG1 is turned on to enable bit line discharge. In this case, the word line waveform can be made close to that assumed during a verify or read operation in the chip. After that, the bit line potential is sensed at a reset time and stored into the page buffer. Then, data of one page is read from the page buffer to the outside of the chip (ST. 10). This operation is iterated a preset number of times while changing V_cgext (ST. 11, ST. 12). As a result, although the voltage at the selected word line WL before and after SG1 is turned on is the constant voltage of V_BR or V_BV when V_cgext is changed, a voltage different from them is applied to the selected word line WL only when V_cgext is applied. When the setting number is reached ("YES"), the "C" level threshold voltage read operation is terminated. One example of an operation waveform of the threshold voltage read operation is shown in FIG. 4.

Thus, according to the semiconductor integrated circuit device according to the present embodiment, the same operation as the verify read operation is performed to read out a threshold voltage when the threshold voltage is read out. Therefore, when the "C" level threshold voltage is read out, the time delay in the word line WL is reflected. As shown in FIG. 10, by reflecting the time delay in the word line WL, the distribution of read threshold voltages can be set closer to the threshold voltage distribution sensed by the sense amplifier in comparison with a case wherein the threshold voltage read operation is performed without reflecting the time delay in the word line WL. Therefore, according to the present embodiment, the threshold voltage read method of the semiconductor integrated circuit device which can read out highly precise threshold voltages and the semiconductor integrated circuit device used to perform the read method can be provided.

As described above, this invention is explained by use of one embodiment, but the embodiment of this invention is not only one embodiment. Further, this invention can be variously modified without departing from the technical scope thereof at the embodying stage thereof.

For instance, in FIG. 3, different read operation methods are employed depending upon whether threshold voltage distribution of the "C" level is estimated. Alternatively, threshold-voltage distribution estimation may be performed concerning both the "C" level and "B" level, using the operation waveforms shown in FIG. 4. In this case, it can be confirmed how the "B" level distribution appears, in the state in which the "C" level distribution is actually verified. Thus, when the "C" level and "B" level distributions are controlled under different read conditions, if the positional relationship between the two distributions and the threshold voltages judged by the actual operations in the chip can be correctly read, the prospects after the acquisition of the threshold voltage distributions can be improved, and can be utilized for the optimization of various setting parameters for controlling the distributions.

Also, the above embodiment contains inventions of various stages and the inventions of various stages can be extracted by adequately combining a plurality of constituents disclosed in the embodiment.

In addition, the above embodiment is explained based on the example in which this invention is applied to a NAND flash memory, but this invention is not limited to a NAND flash memory and can be applied to an AND or NOR flash memory or the like other than a NAND flash memory, for example. Further, a semiconductor integrated circuit device containing the above flash memory, for example, a processor, system LSI or the like are also contained in the scope of this invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of operating a nonvolatile semiconductor memory device which includes a memory cell unit having a selection gate and memory cells, comprising:
   accepting a threshold voltage measuring read voltage from the outside of the device; and
   applying the threshold voltage measuring read voltage to a selected word line with the selection gate kept in the conductive state to read out data of the memory cells at the time of reading out the threshold voltage of the memory cells.

2. The method according to claim 1, wherein the voltage on the selected word line in the threshold voltage read operation is changed from a pre-determined voltage to the threshold voltage measuring read voltage with the selection gate kept in the conductive state.

3. A method of operating a nonvolatile semiconductor memory device which includes a memory cell unit having a selection gate and memory cells, applies a first verify read voltage to a word line with the selection gate kept in a nonconductive state, then makes the selection gate conductive to verify first data, and changes the first verify read voltage to a second verify voltage with the selection gate kept in the conductive state to verify second data after the first data, comprising:
   applying a first threshold voltage measuring read voltage to the word line with the selection gate kept in the nonconductive state and then making the selection gate conductive to read out a threshold voltage of the first data at the time of reading out the threshold voltage of the first data; and
   applying a second threshold voltage measuring read voltage to the word line with the selection gate kept in the conductive state to read out a threshold voltage of the second data at the time of reading out the threshold voltage of the second data.

4. The method according to claim 3, wherein each of the memory cells being capable of storing at least three data values and one of the at least three data values is an erase state.

5. The reading method according to claim 3, wherein whether the operation is a read operation of a threshold voltage of the first data or a read operation of a threshold voltage of the second data is judged when the threshold voltage of one of the first and second data is read out,
   the first threshold voltage measuring read voltage is applied to the word line with the selection gate kept in the nonconductive state when it is judged that the operation is the read operation of the threshold voltage of the first data and then the selection gate is made conductive to permit the threshold voltage of the first data to be read out,
   whether the number of read operations of the threshold voltage of the first data has reached a set number is judged,
   the first threshold voltage measuring read voltage is changed and the read operation of the threshold voltage of the first data is performed again when it is judged that the set number is not reached and the read operation of the threshold voltage of the first data is terminated when it is judged that the set number is reached,
   the second threshold voltage measuring read voltage is applied to the word line with the selection gate kept in the conductive state when it is judged that the operation is the read operation of the threshold voltage of the second data to permit the threshold voltage of the second data to be read out,
   whether the number of read operations of the threshold voltage of the second data has reached the set number is judged, and
   the second threshold voltage measuring read voltage is changed and the read operation of the threshold voltage of the second data is performed again when it is judged that the set number is not reached and the read operation of the threshold voltage of the second data is terminated when it is judged that the set number is reached.

6. The method according to claim 3, wherein the same operation as the operation performed when the first data is verified is performed before the threshold voltage of the second data is read out and then the threshold voltage of the second data is read out after the above operation at the time of reading out the threshold voltage of the second data.

7. The method according to claim 5, wherein the same operation as the operation performed when the first data is verified is performed before the threshold voltage of the second data is read out and then the threshold voltage of the second data is read out after the above operation at the time of reading out the threshold voltage of the second data.

8. The method according to claim 3, wherein the first and second threshold voltage measuring read voltages are applied from the outside of the device.

9. The method according to claim 5, wherein the first and second threshold voltage measuring read voltages are applied from the outside of the device.

10. The method according to claim 6, wherein the first and second threshold voltage measuring read voltages are applied from the outside of the device.

11. The method according to claim 7, wherein the first and second threshold voltage measuring read voltages are applied from the outside of the device.

12. A nonvolatile semiconductor memory device comprising:
- a memory cell unit having a selection gate and memory cells, and
- a write control circuit which controls a write operation of writing data into the memory cell,
- wherein the write control circuit applies a first verify read voltage to a word line with the selection gate kept in a nonconductive state, then makes the selection gate conductive and changes the first verify read voltage to a second verify voltage with the selection gate kept in the conductive state at the verify read operation time, applies a first threshold voltage measuring read voltage to the word line with the selection gate kept in the nonconductive state and then makes the selection gate conductive at the time of reading out the threshold voltage of first data, and applies a second threshold voltage measuring read voltage to the word line with the selection gate kept in the conductive state at the time of reading out the threshold voltage of second data.

13. The device according to claim 12, wherein the write control circuit judges whether the operation is a read operation of a threshold voltage of the first data or a read operation of a threshold voltage of the second data when the threshold voltage of one of the first and second data is read out,
- applies the first threshold voltage measuring read voltage to the word line with the selection gate kept in the nonconductive state when it is judged that the operation is the read operation of the threshold voltage of the first data and then makes the selection gate conductive,
- judges whether the number of read operations of the threshold voltage of the first data has reached a set number,
- changes the first threshold voltage measuring read voltage and then performs the read operation of the threshold voltage of the first data again when it is judged that the set number is not reached and terminates the read operation of the threshold voltage of the first data when it is judged that the set number is reached,
- applies the second threshold voltage measuring read voltage to the word line with the selection gate kept in the conductive state when it is judged that the operation is the read operation of the threshold voltage of the second data,
- judges whether the number of read operations of the threshold voltage of the second data has reached the set number, and
- changes the second threshold voltage measuring read voltage and then performs the read operation of the threshold voltage of the second data again when it is judged that the set number is not reached and terminates the read operation of the threshold voltage of the second data when it is judged that the set number is reached.

14. The device according to claim 12, wherein the first and second threshold voltage measuring read voltages are applied from the outside of the device.

15. The device according to claim 13, wherein the first and second threshold voltage measuring read voltages are applied from the outside of the device.

16. The method according to claim 1, wherein each of the memory cells are capable of storing at least three data values according to threshold voltages.

17. The device according to claim 12, wherein each of the memory cells are capable of storing at least three data values according to levels of threshold voltages.

* * * * *